United States Patent [19]
Baskett

[11] Patent Number: 5,250,847
[45] Date of Patent: Oct. 5, 1993

[54] STRESS ISOLATING SIGNAL PATH FOR INTEGRATED CIRCUITS

[75] Inventor: Ira E. Baskett, Tempe, Ariz.

[73] Assignee: Motorola, Inc., Schaumburg, Ill.

[21] Appl. No.: 928,674

[22] Filed: Aug. 12, 1992

Related U.S. Application Data

[63] Continuation of Ser. No. 722,459, Jun. 27, 1991, abandoned.

[51] Int. Cl.$^5$ .................. H01L 29/04; H01L 21/44
[52] U.S. Cl. .................. 257/773; 257/735; 257/741; 257/576; 257/588; 257/777; 257/778; 257/784; 437/182; 437/186; 437/921
[58] Field of Search .............. 357/59, 68, 69, 70; 257/735, 741, 576, 588, 773, 777, 778, 784; 437/180, 182, 186, 921

[56] References Cited

U.S. PATENT DOCUMENTS

| | | |
|---|---|---|
| 3,487,541 | 1/1970 | Boswell ........................ 257/778 |
| 3,588,628 | 6/1971 | Peck ............................ 257/735 |
| 4,881,117 | 11/1989 | Gandolfi et al. ............... 357/70 |
| 4,924,292 | 5/1990 | Kaufman ...................... 357/70 |
| 4,933,743 | 6/1990 | Thomas et al. ................ 357/69 |
| 4,980,753 | 12/1990 | Dunaway et al. .............. 357/70 |
| 4,990,991 | 2/1991 | Ikeda et al. ................... 257/588 |
| 4,994,895 | 2/1991 | Matsuzaki et al. ............. 357/70 |

*Primary Examiner*—Edward Wojciechowicz
*Attorney, Agent, or Firm*—Joe E. Barbee

[57] ABSTRACT

A stress isolating signal path having one end of fixed to a bonding pad of an integrated circuit chip and another end which forms a flexible bonding surface is provided. The flexible bonding surface may be bonded to external package components or external circuitry using conventional wire bond, epoxy bond, tape automated bonding, flip chip bonding, or the like. The signal path is formed using conventional semiconductor thin film deposition, patterning, and etching techniques. The signal path comprises a conductive material compatible with batch semiconductor manufacturing technology.

8 Claims, 1 Drawing Sheet

STRESS ISOLATING SIGNAL PATH FOR INTEGRATED CIRCUITS

This application is a continuation of prior application Ser. No. 07/722,459, filed Jun. 22, 1991 now abandoned.

BACKGROUND OF THE INVENTION

This invention relates, in general, to wire bonding methods for integrated circuits, and more particularly, to a stress-isolating wire bond for stress sensitive integrated circuits.

As integrated circuits become more complex and incorporate a larger number and wider variety of devices, the circuits become more stress sensitive. Increasing complexity further complicates packaging and actually increases package stress applied to an integrated circuit chip. In particular, silicon strain gauge devices such as pressure sensors and accelerometers are designed to be stress sensitive, thus are particularly affected by packaging stresses. Also, large integrated circuit chips such as memories and microprocessors have a large number of wire bonds, making them more sensitive to wire bond induced stresses. Stress sensitive circuits are effected even more by flip-chip solder bump bonding, which is a leading replacement for conventional wire bonding techniques.

In addition to stress sensitivity, conventional wire bonds are subject to stress caused by chip motion during temperature cycling. Chip motion is even more severe in pressure sensor devices which are mounted with rubber or RTV die bonds. Chip motion can lead to early wire failure as the wire is repeatedly stressed and bent during operation.

Until now, wire bonds were made directly to an upper surface of the integrated circuit. This was necessary because most wire bond techniques require pressure to be applied between the wire and the integrated circuit to form a reliable bond. What is needed is an ability to firmly apply pressure during the wire bond operation, while releasing that pressure after wire bond in a manner which isolates the integrated circuit die from wire bond stresses.

SUMMARY OF THE INVENTION

The advantages of the present invention are achieved by a stress isolating signal path having one end of fixed to a bonding pad of an integrated circuit chip and another end which forms a flexible bonding surface. The flexible bonding surface may be bonded to external package components or external circuitry using conventional wire bond, epoxy bond, tape automated bonding, flip-chip bonding, or the like. The signal path is formed using conventional semiconductor thin film deposition, patterning, and etching techniques. The signal path comprises a conductive material compatible with batch semiconductor manufacturing technology.

DETAILED DESCRIPTION OF THE DRAWINGS

Figure 1:
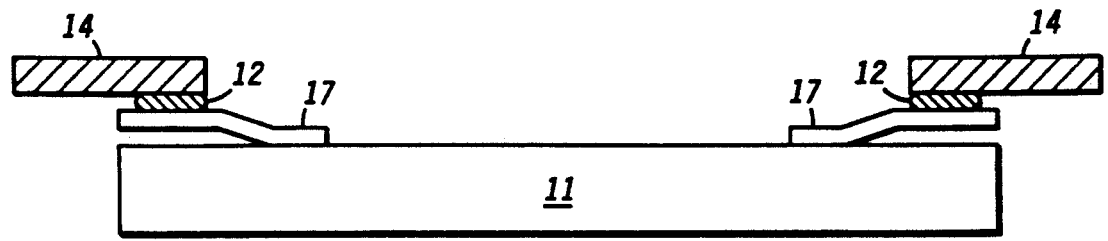
FIG. 1 illustrates, in cross-sectional form, a sensor integrated circuit using stress isolating signal conductors in accordance with the present invention.

FIG. 1 illustrates a highly simplified cross-sectional view of a sensor integrated circuit having a stress isolated signal path 17 in accordance with the present invention. Electronic circuitry and a plurality of bond pads for coupling to the circuitry (not shown) are formed in an upper surface of chip 11. The circuitry formed in the upper surface of chip 11 is often sensitive to external stress, such as stress created by wire bonds as temperature of chip 11 changes during operation. Any stress applied to chip 11 by package mounting components and wire bonds interferes with the integrated circuit's performance.

An important feature of the present invention is stress isolated signal path 17 which couples chip 11 to package lead 14. Stress isolated signal path 17 is illustrated as a simple cantilever structure having one end attached to active circuitry on the IC and another end separated from the active circuitry by a gap. Other flexible structures can easily be manufactured using conventional semiconductor technology, as described hereinafter. In a preferred embodiment, one or more stress isolated signal paths 17 are formed attached to chip 11 replacing conventional rigid bond pads. Package leads 14, of course, take a variety of shapes, depending on the particular package on which chip 11 is mounted. Package component 14 may comprise metal, a ceramic having printed conductors, a printed circuit board, or similar package material used for coupling semiconductor devices.

Signal paths 17 are formed by batch processing while sensor chip 11 is part of a semiconductor wafer having several hundred chips 11. After individual chips 11 are separated from the semiconductor wafer, stress isolated signal paths 17 are attached to package leads 14 by conductive epoxy or solder bump bonding using a bonding material 12 formed on signal paths 17 or package leads 14. Alternatively, conventional wire bonding techniques such as ball bonding or ultrasonic bonding may be used where bonding material 12 is a metal layer such as aluminum or the like. Although the flexible end of signal paths 17 is flexible enough to reduce stress once wire bond is complete, it deflects under the normal pressures of the wire bond process to rest directly on the top surface of chip 11 thus providing a stable surface for conventional wire bonding processes. Some wire bond processes may damage signal path 17 in which case signal path 17 partially processed after wire bond, as described hereinafter.

Signal path 17 absorbs stress induced by motion of chip 11. Such motion is caused by thermal cycling of chip 11, for example. When conventional wire bonds or solder bumps are used without a stress isolating signal path 17, the wire bond or solder bump must absorb this stress repeatedly, often leading to premature failure of the bond. Since stress isolating signal path 17 is flexible, and designed to absorb such stresses, reliability of the bond is greatly improved.

Figure 2:
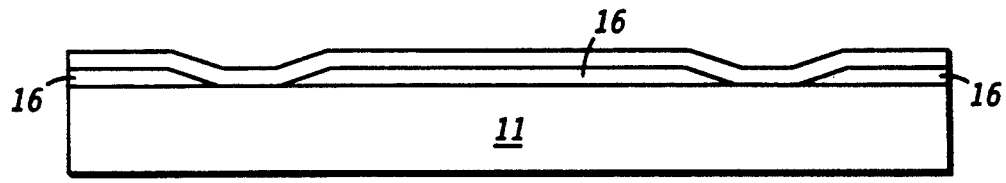
FIGS. 2-3 illustrate, in cross-sectional form, a method of forming mounting springs in accordance with the present invention.

FIG. 2 illustrates sensor chip 11 at an earlier stage in processing. The process for forming stress isolated signal paths 17 begins by forming or depositing a sacrificial layer 16. In a preferred embodiment, sacrificial layer 16 comprises a silicon dioxide, but it is important only that sacrificial layer 16 can be patterned and selectively etched with respect to mounting spring 17. Sacrificial layer 16 is etched to expose portions of the top surface of chip 11 where signal paths 17 will coupled to active circuitry. It should be noted that although signal paths 17 in effect replace connectional bond pads, they do not occupy surface area on chip 11. The present invention thus allows circuitry to be formed on portions of chip 11 which previously were dedicated to bond pads. This feature of the present invention increases packing density of active circuitry on chip 11, reducing chip size and lowering cost.

A layer of spring material is deposited on the surface covering sacrificial layer 16 and contacting chip 11 where exposed by the pattern in sacrificial layer 16. In a preferred embodiment, the spring material comprises a material such as polycrystalline silicon which is desirable because it is highly elastic up to the point of rupture and has a thermal coefficient closely matching the silicon. Also, polysilicon is easily applied, patterned, and etched using conventional semiconductor technology. Polysilicon may be easily doped to provide low resistivity needed for signal paths 17. Because polysilicon has a thermal coefficient closely matching silicon, it is a particularly suitable material for multi-chip modules having a plurality of chips 11 bonded to a common silicon substrate, or bonded to other silicon devices.

Polysilicon is relatively immune to electrochemical action which damages conventional aluminum wires. Until now, such chemical protection could only be provided by expensive sealants and gels applied to protect the metal wires. This feature makes polysilicon signal paths 17 particularly useful for sensor circuits which often must operate in harsh chemical solvent environments.

Figure 3:
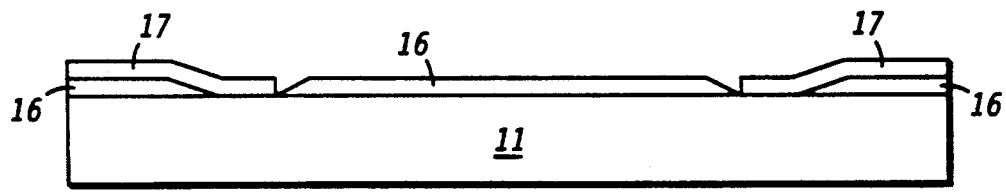

As shown in FIG. 3, spring material is etched to form stress isolated signal paths 17 having a portion affixed to chip 11 and another portion extending over sacrificial layer 16 to form a cantilever beam, separated from the IC by a gap which is as wide as the thickness of sacrificial layer 16. Signal paths 17 thus form a step shaped cantilever once sacrificial layer 16 is removed as shown in FIG. 1. Sacrificial layer 16 can be removed by a conventional etch which is isotropic and selectively etches sacrificial layer 16 with respect to chip 11 and signal paths 17. It is not important that all of sacrificial layer 16 is removed so long as enough is removed that one end of spring 17 is free to move in a lateral direction.

Some wire bond processes may damage signal path 17. This problem is solved if sacrificial layer 16 is left in place, supporting signal path 17, until after wire bond is complete. After wire bond, then, the isotropic etch step is performed to release signal path 17. If this process alternative is used, however, the isotropic etch must be selected to not etch wires (not shown) or bonding material 12 shown in FIG. 1.

Although the preferred embodiments are described in terms of a polysilicon spring material, it may be desirable to use metal, or multilayer materials such as silicon dioxide coated with metal or polysilicon. Other electrically conductive thin film materials are available which can be used in accordance with the present invention. Various materials will, of course, alter spring constant, electrical, and thermal properties of the spring. Also, composition of sacrificial layer 16 may have to be changed if composition of signal paths 17 changes to ensure selective etching as shown in FIG. 3. These variations are within the skill of those familiar with the semiconductor arts and are encompassed within the scope of the present invention.

Figure 4:
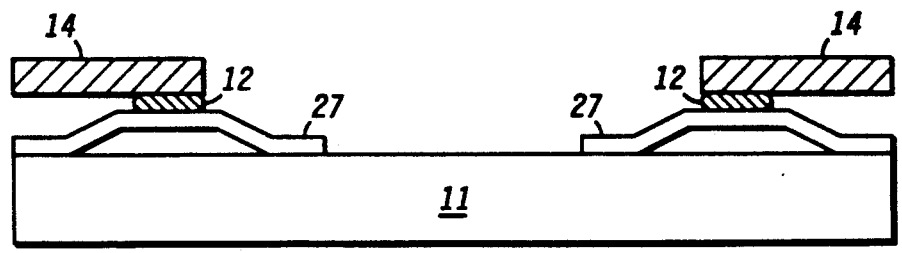
FIG. 4 illustrates, in cross-sectional form, a second embodiment of a sensor integrated circuit having a stress isolating signal conductors in accordance with the present invention.

Another embodiment is illustrated in FIG. 4, which shows a cross-sectional view of a chip 11 mounted diaphragm-like signal paths 27. It may be necessary to cut one or more holes in signal path 27 to allow removal of sacrificial layer 16. It may also be desirable to leave sacrificial layer intact under a number of signal paths 17 to provide rigid bonds to some portions of chip 11. Such modifications and mixing of rigid and flexible bonds are easily accomplished with simple geometry and processing changes to the preferred embodiment. The structure shown in FIG. 4 provides a more rigid bonding surface because signal paths 27 are fully supported and because air damping reduces transient flexibility of signal paths 27. Air damping also effects cantilever signal paths 17 shown in FIG. 1, but will have a more pronounced effect on the structure shown in FIG. 4. Signal paths 17 shown in FIGS. 1-3 and signal paths 27, shown in FIG. 1 may be formed on the same chip.

Other modifications of the present invention are apparent. For example, several signal paths 17 or 27 may be staked on top of each other simply by forming a first signal path in accordance with the process steps outlined above, then repeating the procedure to form additional layers. Also, many geometries may be used rather than the simple straight cantilever structure described in the preferred embodiment. For example, stress isolated signal path 17 may be given a spiral pattern, resulting in a conical spiral shaped signal path once sacrificial layer 16 is removed. By controlling stress incorporated into the spring material when it is deposited as a thin film, the spring constant may be increased so that the free end of spiral shaped signal path 17 springs away from chip 11, resulting in the conical spiral shape.

By now it should be appreciated that an improved integrated circuit signal path structure is provided for stress isolating an integrated circuit from stress induced by package leads and wire bonds. Flexible, micromachined signal paths are formed on an upper or lower surface of integrated circuit using conventional semiconductor manufacturing processes and technology. The signal paths are then bonded to a package lead, again using conventional bonding technology. The resulting structure is less sensitive to mismatch of thermal expansion coefficient between the integrated circuit and the package component, yet relatively inflexible in a vertical direction allowing conventional bonds to be formed on an upper surface of the integrated circuit.

I claim:

1. A stress isolated integrated circuit comprising: an integrated circuit having circuitry formed on an upper surface, wherein the circuitry includes an area for receiving an electrical signal; a polysilicon spring formed on the circuitry and having a first end coupled to the arms for receiving an electrical signal and a second end, wherein the first end is affixed to the integrated circuit and the second end is separated from the upper surface of the integrated circuit by a gap.

2. The IC of claim 1 wherein the spring allows less vertical motion than horizontal motion.

3. The IC of claim 1 wherein the spring comprises doped polysilicon.

4. A method of making a stress signal path for a semiconductor integrated circuit comprising: providing a semiconductor wafer having an upper surface; forming a plurality of integrated circuits in the upper surface, wherein each of the integrated circuits includes an area for receiving an electrical signal; covering the upper surface with a sacrificial layer; patterning the sacrificial layer to expose the area for receiving an electrical signal; covering the sacrifial layer and exposed area with a layer of spring material; patterning the layer of spring material to form a signal path having a first portion affixed to the area for receiving an electrical signal and a second portion extends over the sacrificial layer; and removing the sacrificial layer so that the second portion of the signal path is separated from the upper surface of the semiconductor wafer by a gap.

5. The method of claim 4 wherein the step of covering the sacrifial layer and exposed area with a layer of spring material further comprises depositing a layer of polysilicon.

6. The method of claim 4 wherein the step of covering the sacrifial layer and exposed area with a layer of spring material further comprises depositing a layer of a metal.

7. The method of claim 4 wherein the step of covering the sacrifial layer and exposed area with a layer of spring material further comprises depositing a layer of a dielectric then film covered by a conductive film.

8. The method of claim 4 further comprising a forming a bonding material on an upper surface of the second portion of the signal path.

* * * * *

UNITED STATES PATENT AND TRADEMARK OFFICE
CERTIFICATE OF CORRECTION

PATENT NO. : 5,250,847

DATED : October 5, 1993

INVENTOR(S) : Ira E. Baskett

It is certified that error appears in the above-identified patent and that said Letters Patent is hereby corrected as shown below:

Column 4, claim 1, line 52, after "circuit" insert --chip--.

Column 4, claim 1, line 56, change "arms" to --area--.

Column 5, claim 4, line 4, change "sacrifial" to --sacrificial--.

Column 5, claim 5, line 14, change "sacrifial" to --sacrificial--.

Column 6, claim 6, line 4, change "sacrifial" to --sacrificial--.

Column 6, claim 7, line 8, change "sacrifial" to --sacrificial--.

Column 6, claim 7, line 10, change "then" to --thin--.

Signed and Sealed this

Second Day of August, 1994

*Attest:*

BRUCE LEHMAN

*Attesting Officer*   Commissioner of Patents and Trademarks